INVENTOR.
KERN K. N. CHANG
BY Eugene M. Whitacre
ATTORNEY

July 13, 1965

K. K. N. CHANG 3,195,051

LOW-NOISE HIGH-GAIN STABILIZED NEGATIVE CONDUCTANCE DIODE FREQUENCY CONVERTER

Filed Nov. 28, 1961

2 Sheets-Sheet 2

INVENTOR.
KERN K. N. CHANG
BY Eugene M. Whitacre
ATTORNEY

United States Patent Office 3,195,051
Patented July 13, 1965

3,195,051

LOW-NOISE HIGH-GAIN STABILIZED NEGATIVE CONDUCTANCE DIODE FREQUENCY CONVERTER

Kern K. N. Chang, Princeton, N.J., assignor to Radio Corporation of America, a corporation of Delaware Filed Nov. 28, 1961, Ser. No. 155,380
7 Claims. (Cl. 325—449)

This invention relates to frequency converters and more particularly to frequency converters of the type which employ negative conductance diodes as the nonlinear elements thereof.

It has heretofore been suggested that negative conductance diodes, such as tunnel diodes, be used in low noise frequency converting or mixer circuits for superheterodyne reception to provide frequency conversion with an attendant conversion gain. The process of frequency conversion occurs in such circuits due to the interaction of modulated radio frequency signal waves and locally generated oscillatory waves in a nonlinear region of the diode. Conversion gain is possible in negative conductance diode converters because the diode is operated so that it exhibits a negative conductance over at least a portion of the operating cycle. The negative conductance of the diode overcomes the losses due to the positive conductances present in such circuits.

Extremely high conversion gains have been achieved in negative conductance converters by approaching a condition where the positive loss conductance of the signal input circuit is substantially reduced by the negative conductance which the diode exhibits over a portion of the operating cycle. However high gain operation produces a large conductance mismatch between the diode and the signal input circuit and causes a substantial portion of the incident signal waves to be reflected back to the signal input circuit. Such reflections waste a portion of the signal wave energy and tend to degrade the noise figure of these converters. Furthermore instability, as evidenced by spurious oscillations, sometimes occur in such converters because the reflections tend to become excessive. This is due to the fact that the signal input circuit of a frequency converter, particularly where the input circuit is an antenna circuit, is normally subject to wide changes in conductance as measured in terms of VSWR (voltage standing wave ratio). Thus any slight changes in the conductance of the signal input circuit could cause the positive loss conductance in the circuit to be exceeded by the negative conductance exhibited by the diode, resulting in instability and producing oscillations. Consequently such negative conductance converters are usually operated to provide relatively low conversion gains so as to tolerate wide variations in the input circuit conductance without the danger of spurious oscillations.

Accordingly it is an object of this invention to provide an improved negative conductance frequency converter which exhibits a low noise figure during stable operation at high conversion gain.

It is another object of this invention to provide an improved negative conductance frequency converter which exhibits a high conversion gain and which is stable in operation.

It is a further object of this invention to provide a negative conductance frequency converter which exhibits a high conversion gain and which is substantially immune to relatively wide changes in the signal input circuit admittance.

A frequency converter in accordance with the invention includes a plurality of mixer circuits, with each containing a negative conductance diode to comprise the nonlinear element thereof. A unidirectional wave transmitting device such as a circulator having a multiple number of ports (terminal pairs) is utilized to couple radio frequency signals to the mixer circuits by connecting a signal input circuit to the input port, and by coupling the mixer circuits individually to successive intermediate ports of the device. A matched impedance is connected across the terminating port of the device to provide a matched termination.

Local oscillatory waves are applied directly to the diode in each mixer circuit to heterodyne the radio frequency signals to a corresponding signal of intermediate frequency. The resulting intermediate frequency waves from the mixer circuits are combined in a utilization circuit for further processing.

High conversion gain is provided by stably biasing the diode in the first mixer circuit (the one coupled to the first intermediate port of the device) to a point in the positive conductance region thereof immediately adjacent the negative conductance region, and by making the amplitude of the local oscillatory waves large enough to operate the diode in its negative conductance region for a sufficiently long portion of the operating cycle to eliminate substantially all of the positive losses in the signal input circuit.

Stable operation is provided by preventing the creation of standing waves in the signal input circuit caused by reflections of signal wave energy from the first mixer circuit. The unidirectional wave transmitting device couples the reflected wave energy substantially only to the next successive intermediate port where a second one of the mixer circuits is connected. The diode in the second mixer circuit is stably biased to a point in a positive conductance region thereof such that the local oscillatory waves drive the diode into the negative conductance region only during a small part of the operating cycle. Such biasing produces a substantially matched admittance at this port of the device and appreciably reduces reflection of radio frequency wave energy from the second mixer circuit.

Any reflections that do occur in the second mixer circuit are transmitted by the unidirectional device to a next successive port where another mixer circuit may be coupled. Alternatively this port may be utilized as the terminating port of the device with a matched terminating impedance coupled thereacross to dissipate any wave energy incident thereon. Therefore substantially no wave energy is reflected back to the signal input circuit and the standing wave ratio remains low at a minimum regardless of admittance changes in the signal input circuit.

The combination of the mixer circuits utilizes substantially all of the incident signal power and provides a low noise figure for the frequency converter.

Thus a frequency converter in accordance with the invention provides high conversion gain with a low noise figure and is stable in operation.

The novel features which are considered to be characteristic of this invention are set forth with particularity in the appended claims. The invention itself however, both as to its organization and method of operation, as well as additional objects and advantages thereof, will best be understood from the following description when read in conjunction with the accompanying drawing in which:

Figure 1:
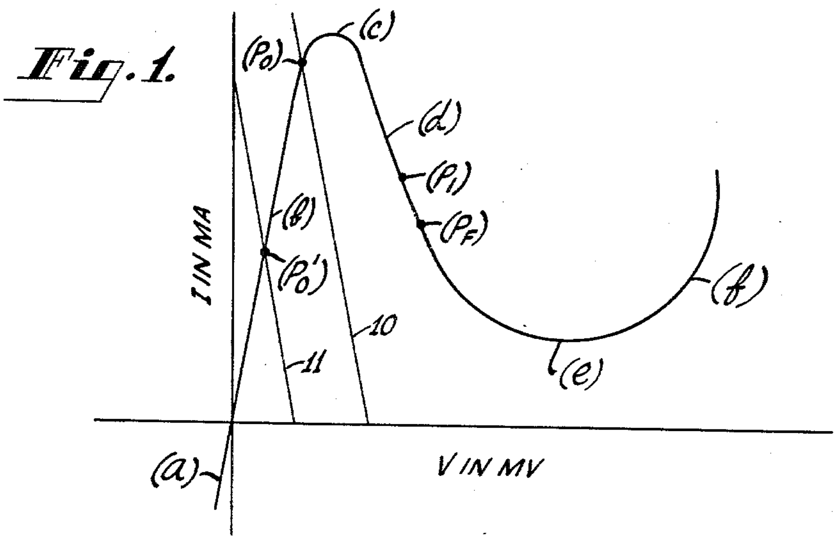
FIGURE 1 is a graph illustrating the current-voltage characteristic of a negative conductance semiconductor diode of a type which may be employed in the invention.

Reference is now made to FIGURE 1, which is a graph illustrating the current-voltage characteristic of a negative conductance tunnel diode suitable for use in circuits embodying the invention. Such a diode has been described by H. S. Sommers, Jr. in the article "Tunnel Diodes as High Frequency Devices," in the Proceedings of the IRE, July 1959, page 1201. For voltages in the back or reverse direction, the reverse current of the diode increases as a function of the voltage, as is shown by the region (*a*) in FIGURE 1. For small values of voltages in the forward direction, the initial forward current also increases as a function of voltage, as is shown by the region (*b*). As the forward voltage is increased further, the forward current first reaches a maximum or peak value in the region (*c*) and then begins to decrease. The decrease in forward current continues throughout the region (*d*), which is the negative conductance region. A point of inflection ($P_F$) occurs in the negative conductance region (*d*). A current minimum is reached in the region (*e*), whereupon the current-voltage characteristic turns into the usual forward characteristic of a semiconductor diode, as is shown by the region (*f*).

The slope of the current-voltage characteristic of the negative conductance diode exhibits large degrees of nonlinearity when changing from a positive to a negative slope, and vice versa, as in the regions (*c*) and (*e*) respectively of FIGURE 1. By biasing the diode for stable operation in such regions, the most efficient mixing or heterodyning of applied signal and oscillatory waves will be obtained. The diode may be biased to operate stably on either the positive or negative slopes of the diode characteristic adjacent the regions (*c*) or (*e*). Particularly good operating characteristics of a frequency converter embodying the invention have been observed when the diode is biased for operation in the region (*c*) as for example at the point $P_0$, as shown in FIGURE 1.

To stably bias the diode for operation about the point $P_0$ requires a forward biasing circuit which exhibits a load line such as 10 as shown in FIGURE 1. The load line 10 is characterized by the fact that it intersects the current-voltage characteristic of the diode at one point only ($P_0$). A line such as 10 may be obtained by utilizing a biasing circuit, the resistance of which is less than the absolute value of minimum negative resistance of the diode.

Figure 2:
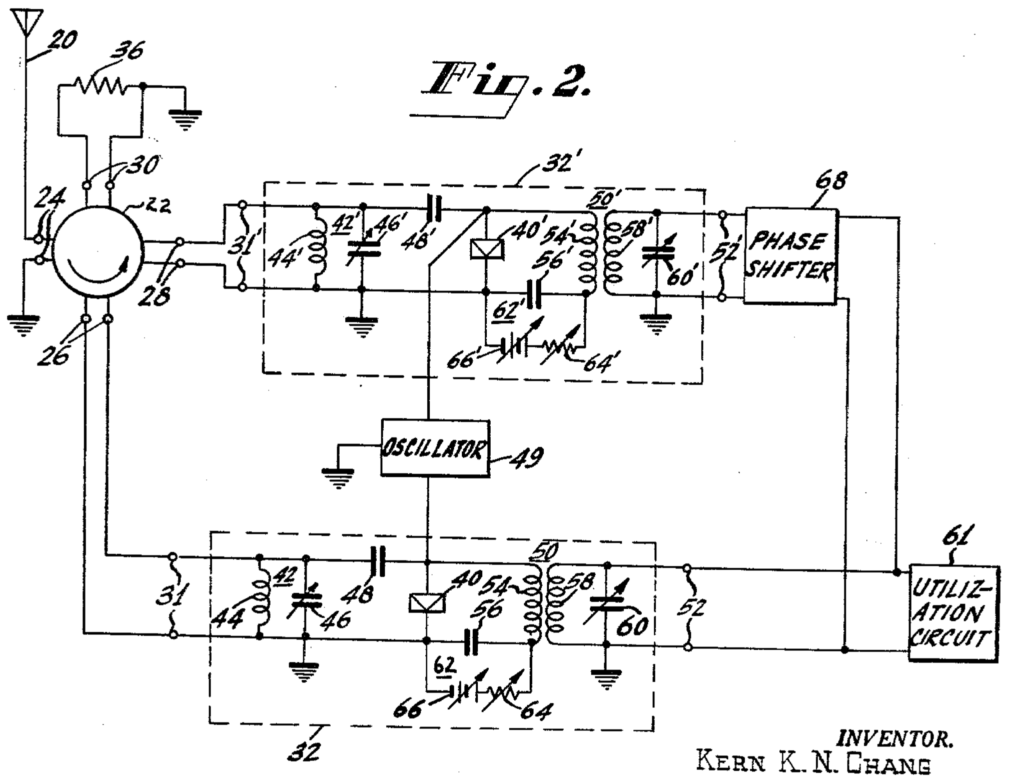
FIGURE 2 is a schematic circuit diagram, partly in block form, of a frequency converter embodying the invention.

A schematic circuit diagram, partly in block form, of a frequency converter in accordance with the invention is shown in FIGURE 2. Radio frequency signals intercepted in an antenna 20 are applied to a unidirectional wave transmitting device 22. The unidirectional wave transmitting device 22 has a multiple number of sections as defined by the ports (terminal pairs) 24, 26, 28 and 30, and the antenna 20 is coupled to the input port 24 thereof. The input terminals 31 of a first negative conductance diode mixer circuit 32 is connected across the intermediate port 26 while the input terminals 31' of a second negative conductance diode mixer circuit 32' is coupled to the other intermediate port 28. A matched terminating resistor 36 is connected across the remaining port 30 of the device 22.

The unidirectional wave transmitting device 22 may for example comprise a circulator and has been shown as such in FIGURE 2. The circulator 22 is a nonreciprocal device preferably of the reactance type which is constructed to transmit wave energy incident on one port to only the next successive port, in the direction of the arrow shown in FIGURE 2. Thus, for example, wave energy incident on the port 24 is transmitted only to the port 26 and applied to the mixer circuit 32. Wave energy reflected back from the mixer circuit 32 to the port 26 is transmitted only to the port 28. Similarly any wave energy reflected back to the port 28 from the mixer circuit 32' is transmitted only to the port 30 where the matched terminating resistor 36 is connected. The matched terminating resistor 36 prevents wave energy from being reflected back to the input port 24. This coupling of wave energy only to a next successive port is contrary to the normal bilateral mode of operation expected of passive elements and is obtained by the use of magnetized bimetallic ferrites in such devices. Circulators have been described as for example in the article "The Elements of Non-Reciprocal Microwave Devices," Proceedings of the IRE, October 1956, page 1345 and one such structure is disclosed in Patent No. 2,748,352.

The negative conductance diode mixer circuit 32 includes a negative conductance diode 40, which may be of the type having the characteristic shown in FIGURE 1. A tuned input circuit 42, comprising the parallel combination of an inductor 44 and a variable capacitor 46, is connected across the input terminals 31. The input circuit 42, which is tuned to select desired radio frequency signal waves, is also coupled across the diode 40 through a D.-C. blocking capacitor 48. A local oscillator 49 is also coupled directly across the diode 40 to apply heterodyning waves thereto. The capacitor 48 is selected to exhibit a low reactance at signal and local oscillator frequencies to prevent attenuation at these frequencies. An output transformer 50 is provided to couple beat frequency output waves, produced in the diode 40, to a pair of output terminals 52. The transformer 50 includes a primary winding 54, which is connected in series with a capacitor 56 across the diode 40, and a secondary winding 58, across which is coupled a variable capacitor 60 to provide a tuned secondary circuit. The secondary circuit is tuned to one of the beat frequency waves produced in the diode 40 which may be the difference, or intermediate, frequency waves. The intermediate frequency waves are applied to a utilization circuit 61 which may include an I.-F. amplifier 61 which is connected across the output terminals 52. The primary winding 54 is selected to exhibit a high reactance at signal and local oscillator frequencies to prevent waves at these frequencies from bypassing the diode 40.

The negative conductance diode 40 is forward biased by a suitable biasing voltage source 62 which comprises a variable resistance 64 and a variable battery 66. The biasing source 62 is connected in parallel with the capacitor 56 and biases the negative conductance diode 40 through the primary winding 54 of the intermediate frequency transformer 50. The biasing source 62 is adjusted to exhibit a load line 10 to bias the diode to the point ($P_0$), as shown in FIGURE 1. The capacitor 56 in addition to being an A.C. bypass capacitor also performs the function of stabilizing the biasing source 62 to prevent parasitic oscillations from developing in this circuit when the negative conductance diode 40 is operating in its negative conductance region.

For stability, the combined conductances of the circulator 22 and the tuned circuit 42 at radio frequencies are selected to exceed the absolute value of maximum negative conductance of the diode 40. Similarly, at intermediate frequencies, the combined conductances of the utilization circuit 61 and the tuned output transformer 50 are also selected to exceed the absolute value of maximum negative conductance of the diode 40.

The second negative conductance diode mixer circuit 32' is coupled to the intermediate port 28 of the circulator 22. The second mixer circuit 32' is identical in construction to the first mixer circuit 32 so will not be described. However the biasing source 62′ in this mixer circuit is adjusted to exhibit a load line such as 11 as shown in FIGURE 1 to bias the diode 40′ to a point ($P_0'$), for reasons to be hereinafter explained. The I.-F. signal output of the second mixer circuit 32′ is applied through a phase shifting circuit 68 to the utilization circuit 61 in parallel with the I.-F. signal output of the first mixer circuit 32. The phase shifting circuit 68 insures that the I.-F. signals from both mixer circuits are in phase so that additive I.-F. signals are applied to the utilization circuit 61.

In operation, radio frequency modulated waves intercepted by the antenna 20 are applied to the input port 24 of the circulator 22 and transmitted to the next successive port 26. The radio frequency waves incident on the port 26, and the heterodyning waves from the local oscillator 49, are applied to the diode 40 in the mixer circuit 32. The input circuit 42 of the mixer 32 is broadly tuned to waves at both frequencies so as to select desired R-F signals as well as to prevent local oscillatory waves from being shunted around the diode 40. The excursions of the local oscillatory and radio frequency signal waves drive the diode 40 through the nonlinear region (*c*) and into the negative conductance region (*d*) of FIGURE 1. The excursion through the region (*c*) causes a nonlinear interaction of the applied signal and local oscillatory waves and produces modulation bearing sidebands. The excursion into the negative conductance region (*d*) causes the diode 40 to reduce the positive losses in the circuit. High conversion gains are achieved by making the amplitude of the local oscillatory voltage swing large enough to drive the diode 40 deeply into the negative conductance region (*c*), such as to a point ($P_1$) in FIGURE 1, where the instantaneous value of the current through the diode 40 is smaller than the D.-C. biasing current at the operating point ($P_0$). Such operation insures that a sufficiently large portion of the operating cycle occurs in the negative conductance region so that the positive losses in the circuit are substantially reduced. For stability it is desirable that the diode 40 not be driven through the inflection point ($P_F$).

The secondary circuit of the output transformer 50 is tuned to select the lower sideband or intermediate frequency waves, and the I.-F. waves are applied to the utilization circuit 61 for further processing.

Since the diode 40 in the mixer circuit 32 is operated in the negative conductance region thereof for a large portion of the operating cycle, the input admittance of the mixer 32 does not provide a matched termination for the port 26 of the circulator 22. Consequently a substantial amount of radio frequency wave energy is reflected back to the port 26. The unidirectional wave transmitting characteristics of the circulator 22 prevent the reflected waves from returning to the antenna 20. Therefore substantially no standing waves are created in the antenna 20. Accordingly, the mixer circuit 32 is effectively isolated from conductance changes in the antenna 20 and wide variations in the conductance thereof will not result in parasitic oscillations being produced in the converter.

The reflected wave energy from the mixer circuit 32 is transmitted by the circulator 22 to the port 28 thereof and applied to the diode 40′ in the second mixer circuit 32′. The diode 40′ by being biased at the point ($P_0'$) as shown in FIGURE 1, is only driven by the local oscillatory waves slightly past the peak current point in the region (*c*). Such operation, while not producing a conversion gain of much greater than unity for this circuit does provide a better conductance match at the port 28 and substantially reduces the amount of reflection from this circuit. Otherwise the operation of the mixer circuit 32′ is identical to that of the mixer circuit 32. The I.-F. signal output of the mixer circuit 32′ is applied to the phase shifting circuit 68 which compensates for any difference in phase between the I.-F. signal outputs of the mixers 32 and 32′. Such a phase difference may be caused by the phase shift that occurs in the R-F signal waves when transmitted between the ports 26 and 28 in the circulator 22. Alternatively the phase shifting circuit 68 may be connected between the output terminals 52 of the mixer circuit 32 and the utilization circuit 61. In either case, in phase I.-F. signals from both the mixer circuits 32 and 32′ are applied to the utilization circuit 61 where they are added and further processed. The combined mixer circuits 32 and 32′ provide a high conversion gain for the frequency converter.

Any small amount of reflected signal wave energy from the mixer circuit 32′ is transmitted by the circulator 22 to the port 30 thereof. A resistor 38, which matches the characteristic impedance of the circulator 22, terminates the port 30 and prevents reflection of wave energy back to antenna 20. This insures that the frequency converter is rendered substantially immune to conductance variations in antenna 20.

If desired, a frequency converter having a larger number of mixer circuits could be used so that all of the received radio frequency signal power is usefully converted. Utilizing all of the received signal power provides a low noise figure for the converter. However, it has been found that two mixer circuits provide a desirable balance between the full utilization of R-F signal power and cost.

Thus, a negative conductance diode frequency converter is provided which exhibits a high conversion gain without producing parasitic oscillations and which has a low noise figure.

Figure 3:
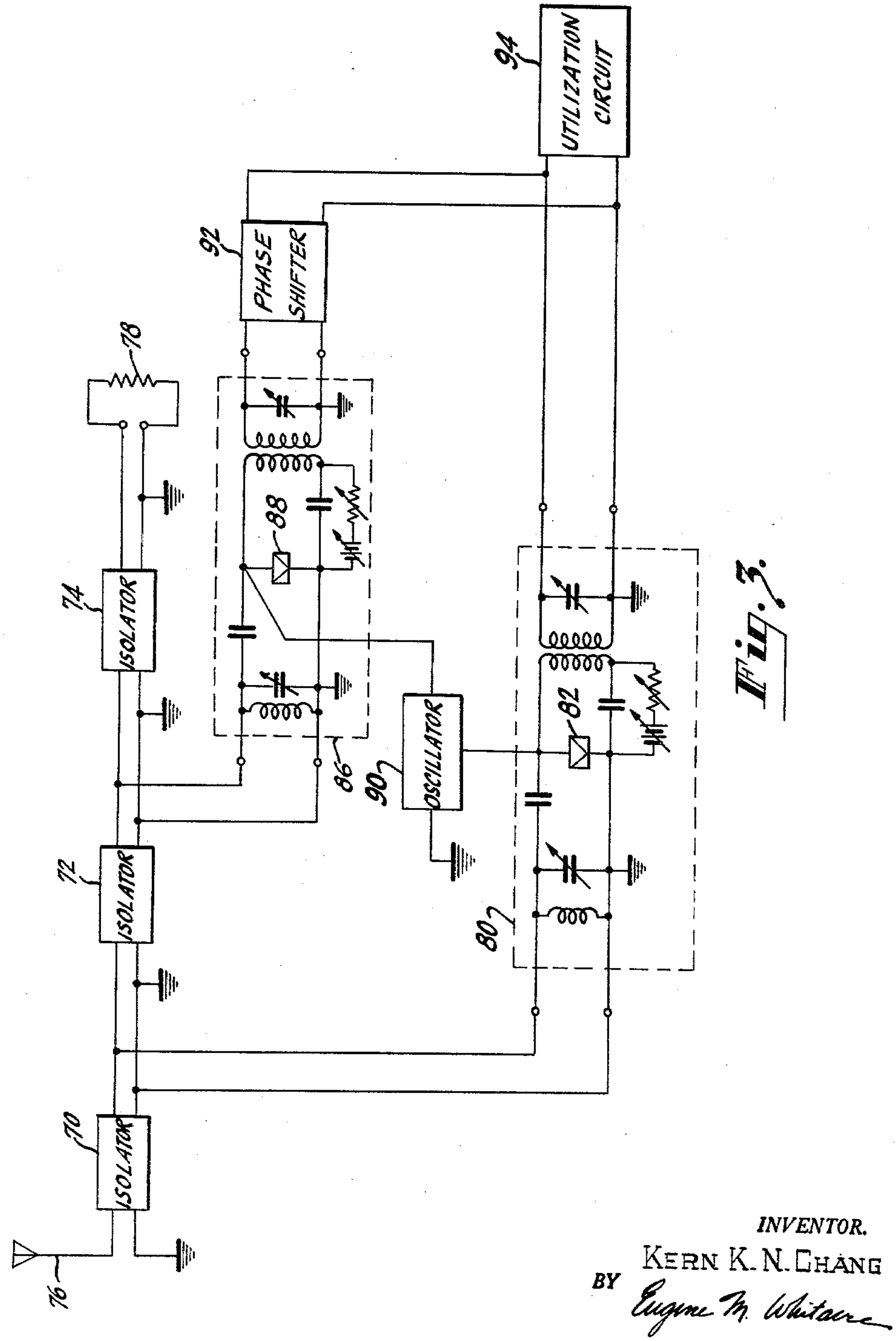
FIGURE 3 is a schematic circuit diagram, partly in block form, of a frequency converter illustrating another embodiment of the invention.

In FIGURE 3, there is illustrated another embodiment of the invention. The major difference between this embodiment and that illustrated in FIGURE 2 is that a plurality of isolators, rather than a circulator, is utilized to provide the unidirectional wave transmitting characteristics for stability in operation.

A plurality of unidirectional wave transmitting devices 70, 72 and 74 are coupled in series between an antenna 76 and a terminating resistor 78. A first negative conductance mixer circuit 80, including a negative conductance diode 82, is coupled to the junction between the unidirectional wave transmitting devices 70 and 72. A second negative conductance mixer circuit 86, which includes a negative conductance diode 88, is coupled to the junction between the unidirectional wave transmitting devices 72 and 74. A source of local oscillatory waves 90 is coupled in parallel across the diodes 82 and 88. A phase shifting circuit 92 is utilized to couple the I.-F. signal output of the mixer circuit 86 to a utilization circuit 94 while the I.-F. signal output of the mixer circuit 80 is directly connected to the utilization circuit 94.

The unidirectional wave transmitting devices 70, 72 and 74 may for example comprise nonreciprocal ferrite-loaded isolators preferably of the reactance type. Such devices have been described in the hereinbefore referenced article and in the Patent No. 2,748,353. The mixer circuits 80 and 86 may be identical to the mixer circuits 32 and 32′ respectively of FIGURE 2. The phase shifting circuit 92 may also be identical to the phase shifter 68 of FIGURE 2 provided that the phase shift which occurs in the R-F signals when traversing the isolator 72 is equal to the phase shift which occurs between the ports 26 and 28 in the circulator 22.

The operation of the embodiment of the invention shown in FIGURE 3 is substantially similar to that of the embodiment of FIGURE 2. Reflected waves are prevented from being transmitted back to the antenna 70 by the unidirectional wave transmitting characteristics exhibited by the isolators 70, 72 and 74 and substantially all of the signal wave energy is usefully converted. Thus the frequency converter of FIGURE 3 exhibits a high conversion gain with a low noise figure and is stable in operation.

What is claimed is:

1. An electrical circuit for frequency converting signals from a source of radio frequency waves comprising in combination, a plurality of negative conductance diode mixer circuits, means for unidirectionally applying radio frequency waves from said source to each of said mixer circuits in succession, means for applying local oscillatory waves to each of said mixer circuits, and means coupled to each of said mixer circuits for deriving beat frequency waves produced by the interaction of said radio frequency signals and said local oscillatory waves in each of said mixer circuits.

2. An electrical circuit for mixing radio frequency waves intercepted in an input antenna circuit with oscillatory waves generated in a local oscillator comprising the combination of first and second negative conductance diode mixer circuits, means for coupling said local oscillator to each of said mixer circuits, a plurality of unidirectional wave transmitting devices, a first one of said devices coupling said antenna circuit to said first mixer circuit to apply radio frequency signals thereto, a second one of said devices coupling said first mixer circuit to said second mixer circuit to apply thereto radio frequency signals reflected from said first mixer circuit, and an output circuit coupled to each of said first and second mixer circuits to derive beat frequency waves produced by the interaction of said radio frequency signals and said local oscillatory waves in each of said first and second mixer circuits.

3. A frequency converter comprising in combination, a unidirectional wave transmitting device having a given characteristic impedance and a plurality of ports, said device exhibiting the characteristic that wave energy incident on any one port is transmitted substantially only to a next successive port of said device, a source of radio frequency signals coupled to a first port of said device, a first negative conductance diode mixer circuit coupled to a second port of said device to receive radio frequency signals from said source, a second negative conductance diode mixer circuit coupled to a third port of said device to receive radio frequency signals reflected from said first mixer circuit, an impedance selected to match the characteristic impedance of said device coupled to a fourth port thereof to dissipate radio frequency signals reflected from said second mixer circuit, a source of local oscillatory waves coupled to each of said first and second mixer circuits to apply heterodyning waves thereto, and a utilization circuit coupled to each said first and second mixer circuits to derive beat frequency waves produced by the interaction of said radio frequency signals and said local oscillatory waves in each of said first and second mixer circuits.

4. A frequency converter comprising in combination a unidirectional wave transmitting circulator having a given characteristic impedance and a plurality of ports, a source of radio frequency signals coupled to a first port of said circulator, first and second negative conductance diode mixer circuits coupled to a second and a third port respectively of said circulator, an impedance selected to match the characteristic impedance of said circulator coupled to a fourth port thereof, a source of local oscillatory waves coupled to said first and second negative conductance diode mixer circuits, and a utilization circuit coupled to each of said first and second mixer circuits to derive beat frequency waves produced by the interaction of said radio frequency signals and said local oscillatory waves in each of said first and second mixer circuits.

5. A frequency converter comprising in combination a unidirectional wave transmitting circulator having a given characteristic impedance and a plurality of ports, a source of radio frequency signals coupled to a first port of said circulator, a first negative conductance diode mixer circuit having an input impedance which differs from said characteristic impedance coupled to a second port of said circulator to receive the radio frequency signals incident on said first port, a second negative conductance diode mixer circuit having an input impedance which substantially matches said characteristic impedance coupled to a third port of said circulator to receive the radio frequency signals reflected from said first mixer circuit, an impedance selected to match said characteristic impedance coupled to a fourth port of said circulator to dissipate any radio frequency signals reflected from said second mixer circuit, a source of local oscillatory waves coupled to said first and second mixer circuits to apply heterodyning waves thereto, and a utilization circuit coupled to said first and second mixer circuits to derive beat frequency waves produced by the interaction of said radio frequency signals and said local oscillatory waves in each of said first and second mixer circuits.

6. A frequency converter comprising in combination a unidirectional wave transmitting circulator having a given characteristic impedance and a plurality of ports, a source of radio frequency signals coupled to a first port of said circulator, a first negative conductance diode mixer circuit having an input impedance which differs from said characteristic impedance coupled to a second port of said circulator, a second negative conductance diode mixer circuit having an input impedance which substantially matches said characteristic impedance coupled to a third port of said circulator, a resistor selected to match the characteristic impedance of said circulator coupled to a fourth port thereof, a local oscillator coupled to said first and second mixer circuits to apply heterodyning waves thereto, a utilization circuit for processing beat frequency waves produced by the interaction of said radio frequency signals and said local oscillatory waves in each of said first and second mixer circuits, means for coupling said first mixer circuit to said utilization circuit, and means including a phase shifting circuit for coupling said second mixer circuit to said utilization circuit, said phase shifting circuit compensating for the phase shift that occurs in the radio frequency signals reflected from said first mixer circuit during transmission from the second to the third ports of said circulator.

7. A frequency converter comprising in combination, first and second negative conductance mixer circuits, each of said mixer circuits including a nonlinear tunnel diode having in the forward bias direction first and second positive conductance regions separated by a negative conductance region, means for stably biasing the diode in said first mixer circuit to a point in the first positive conductance region immediately adjacent said negative conductance region, means for stably biasing the diode in said second mixer circuit to a point in the first positive conductance region which is distant from the negative conductance region thereof, a source of local oscillatory waves connected in parallel with each of said diodes, the amplitude of said local oscillatory waves having an amplitude sufficient to drive the diode in said first mixer circuit to a point in the negative conductance region thereof where the instantaneous value of current through the diode is less than the current through the diode at the biasing point so that the diode exhibits a negative conductance over a large portion of the operating cycle, a circulator having a given characteristic impedance and four ports, a source of radio frequency signals coupled to the first port of said circulator, means for coupling said first mixer circuit to the second port of said circulator to receive radio frequency signals incident on said antenna circuit, means for coupling said second mixer circuit to the third port of said circulator to receive radio frequency signals reflected from said first mixer circuit due to the operation of the diode in said first mixer circuit in the negative conductance region thereof, a resistor selected to match the characteristic impedance of said circulator coupled across the fourth port thereof to dissipate any radio frequency signals reflected from said second mixer circuit and prevent transmission back to the first port of said circulator, and a utilization circuit coupled to said first and second mixer circuits to process the beat frequency waves produced by the inter-action of the radio frequency signals and local oscillatory waves in the nonlinear conductance regions of each of said diodes.

References Cited by the Examiner

UNITED STATES PATENTS

| | | | |
|---|---|---|---|
| 2,538,068 | 1/51 | Williams | 325—435 |
| 2,628,308 | 2/53 | Norton | 325—449 |
| 2,914,671 | 11/59 | De Lange | 328—92 |
| 2,978,576 | 4/61 | Watters | 325—443 |

DAVID G. REDINBAUGH, *Primary Examiner.*